United States Patent [19]

Dingwall

[11] 4,045,250
[45] Aug. 30, 1977

[54] METHOD OF MAKING A SEMICONDUCTOR DEVICE

[75] Inventor: Andrew Gordon Francis Dingwall, Somerville, N.J.

[73] Assignee: RCA Corporation, New York, N.Y.

[21] Appl. No.: 601,832

[22] Filed: Aug. 4, 1975

[51] Int. Cl.² .................. H01L 7/54; H01L 21/265
[52] U.S. Cl. ............................ 148/1.5; 148/187
[58] Field of Search ........................... 148/1.5, 187

[56] References Cited
U.S. PATENT DOCUMENTS

| | | | |
|---|---|---|---|
| 3,756,861 | 9/1973 | Payne et al. | 148/1.5 |
| 3,767,492 | 10/1973 | MacRae et al. | 148/1.5 X |
| 3,783,047 | 1/1974 | Paffen et al. | 148/1.5 X |
| 3,793,088 | 2/1974 | Eckton, Jr. | 148/1.5 |
| 3,793,090 | 2/1974 | Barile et al. | 148/1.5 |

Primary Examiner—L. Dewayne Rutledge
Assistant Examiner—John M. Davis
Attorney, Agent, or Firm—H. Christoffersen; R. P. Williams

[57] ABSTRACT

A method of making a semiconductor device which has regions of differing type and/or degree of conductivity includes the use of a multi-layer masking coating on selected regions of a body of semiconductor, and a mono-layer masking coating on other selected regions. Ion implantation together with chemical diffusion is used with a single photoresist mask to create regions of both relatively high and relatively low conductivity of one type. A second photoresist mask may be used with ion implantation and chemical diffusion to produce regions of opposite type conductivity with differing degrees of conductivity.

6 Claims, 9 Drawing Figures 4,045,250

METHOD OF MAKING A SEMICONDUCTOR DEVICE

This invention relates to the fabrication of semiconductor devices.

Relatively complex semiconductor devices, such as integrated circuit devices, usually require certain regions to be formed within a body of semiconductor material, these regions being of different types and/or degrees of conductivity. One typical device, known as a complementary MOS integrated circuit device, has transistors with carrier channels of opposite type conductivity, formed in a monolithic body of semiconductive material. Ordinarily, a well region, which provides the substrate for a transistor of one type, is formed in a limited area of the body adjacent to its surface. Transistors of the one type are formed in the well region and transistors of the opposite type are formed in the body of semiconductive material outside the well region.

One problem which has existed with complementary integrated circuit devices of this type has been that of leakage caused by unwanted surface channels. It has been common practice to include in such devices surface channel counteracting means in the form of doped regions between the transistors which must be isolated. In many devices, the surface channel counteracting means has been relatively highly doped guard bands of either P+ and N+ type conductivity. Because relatively highly doped areas of opposite conductivity type, if in contact with each other, provide a PN junction having a relatively low breakdown strength, it has usually been necessary heretofore to maintain some minimum spacing between adjacent guard bands.

It is known to utilize relatively lightly doped zones as surface channel counteracting means and to allow those zones to contact each other so as to establish a PN junction between them. Care must be taken in making devices having this structure to assure that the breakdown strength of the PN junctions formed between adjacent guard bands is adequate to withstand the operating voltages of the device.

As they have been manufactured in the past, devices having the properties outlined above have required many processing steps. A separate photomask has been required to define each of the regions of different type and/or degree of conductivity. A method which would produce such a structure with fewer masking steps can improve the fabrication yields and therefore the economy of fabrication of such devices.

Figure 9:
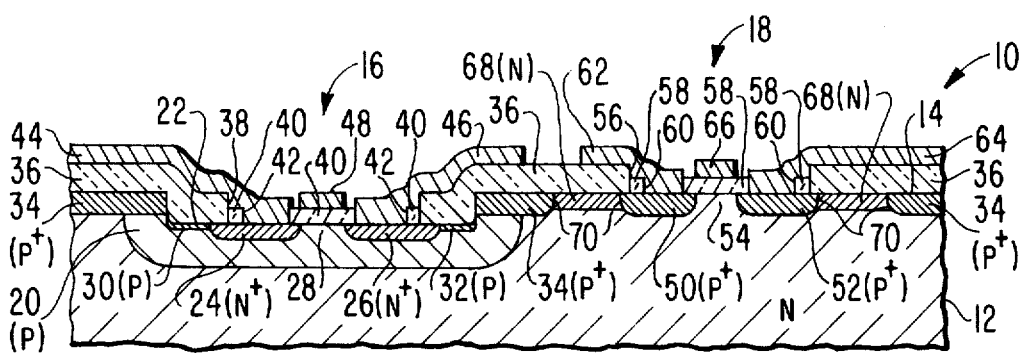
FIG. 9 is a representation of the cross-section of a finished device.

A portion of an integrated circuit device 10 of the complementary MOS type is illustrated in completed form in FIG. 9. The device 10 has a body 12 of semiconductive material, preferably silicon, which has a surface 14 on which the processing steps to be described hereinafter are performed. In this example, the body 12 is initially of N type conductivity.

MOS transistors 16 and 18 have the material of the body 12 as the semiconductive portions thereof. The transistor 16 is an N channel transistor and includes in its structure a P well region 20 formed in the body 12 adjacent to the surface 14. It will be noted that there is a slight recess in the body 12 in the location of the transistor 16, that is, that there is another surface 22 generally parallel with the surface 14 at the location of the transistor 16. The reason for this recess is related to the processing used to form the device and the recess performs no substantially useful function as such in the structure.

The transistor 16 also has a pair of spaced N+ type regions 24 and 26 which may be source and drain regions, respectively, for the device. Between the regions 24 and 26 is a zone 28 which is the conduction channel zone for the transistor 16. Adjacent to those portions of the regions 24 and 26 which are remote from the channel zone 28 there are zones 30 and 32 which contain acceptor impurities in a slightly greater concentration than the concentration in the P well 20 but not sufficiently greater to be called P+.

Adjacent to the peripheral boundaries of the P well 20, and at other locations in the device as determined by the processing there are surface adjacent regions 34 of P+ type conductivity. These regions serve as P type surface channel counteracting means.

The transistor 16 also comprises conventionally formed contacts and gate electrode means. On the surface 14 of the device 10 is a relatively thick insulating layer 36, which is a so-called field oxide. As in conventional devices, this oxide aids in the prevention of surface leakage channels. An aperture 38 in the thick insulating layer 36 defines the specific area of the transistor 16. Within this aperture there is a gate insulating layer 40 which is provided with apertures 42 to allow contact to be made to the regions 24 and 26. The gate insulator layer 40 should have the clean properties which are usual in such insulators. The transistor 16 also has deposited conductors 44, 46, and 48 which may act as source, drain and gate conductors, respectively.

The transistor 18 has, within the body 12, spaced regions 50 and 52 of P+ type conductivity which define between them a channel zone 54. The regions 50 and 52 may have the same depth and doping concentration profile as the regions 34. An aperture 56 exists in the thick insulating layer 36 in the active area of the transistor 18. Within this aperture, a gate insulator layer 58 like the gate insulator layer 40 is provided and this insulator layer has apertures 60 for the reception of contacts to the regions 50 and 52. Conductor layers 62, 64 and 66 complete the structure of the transistor 18. The conductors 62 and 64 may each have portions extending into the aperture 60 into contact with the regions 50 and 52 and may serve as source and drain conductors, respectively. The conductor layer 66 overlies the channel zone 54 and acts as a gate electrode.

The device 10 also comprises surface-adjacent channel counteracting zones 68, which are doped more heavily N type than the body 12. The zones 68 extend thoughout the entire surface-adjacent area of the body 12 between bounding P+ type regions 34 and 50 and 52, respectively, so as to define PN junctions 70 at each intersection. In the normal operation of the device these PN junctions will be reversed biased to the maximum voltage applied to the device and, for this reason, the doping concentration in the regions 34, 50 and 52 and the region 68 should be selected carefully to ensure that the reverse breakdown strength of the PN junctions 70 will be significantly greater than the maximum operating voltages.

The two transistors 16 and 18 may be interconnected with each other, although such interconnection is not shown, in any way known in complementary integrated circuit design. Of course, additional transistors may be formed in the device 10 and any complementary logic circuit may be implemented.

The present novel method of making a complementary MOS integrated circuit device of the type described in FIG. 9, which has non-spaced surface channel counteracting zones of mutually opposite type conductivity, is illustrated in FIGS. 1 to 9 in sequence. It will be understood by those of ordinary skill that certain steps of surface cleaning, surface preparation, and the like will be performed interspersed wih the steps which are described.

The present method begins with a body 12 of semiconductive material such as silicon which is initially of one type conductivity, N type in this example. The surface 14 of the body 12 is first prepared for the reception of a multi-layer first masking coating 72, which includes a first layer 74, on the surface 14, of a material which is soluble in a given solvent. For example, the layer 74 may comprise thermally grown silicon dioxide, grown in conventional manner, which is soluble in buffered hydrofluoric acid for example. A second layer 76 is above, i.e., in this example, on the first layer and this layer 76 is of a material which is insoluble in a solvent which is a solvent for the first layer. For example, the layer 76 may comprise silicon nitride. The layer 76 is employed to mask the first layer 74 and to protect the first layer 74 is subsequent processing steps as will appear hereinafter.

The masking coating 72 has an opening 78 therein patterned to define the surface shape of the well region 20 of conductivity type opposite to that of the body 12, P type in this example. The opening 78 is formed by conventional processes including photolithographically masking the second layer 76, etching this layer away with a solvent for the material of the layer 76, which may be hot phosphoric acid where the layer 76 is silicon nitride. Thereafter, the material of the layer 74 which is exposed in this etching step is removed by contacting it with a buffered hydrofluoric acid etchant, for example. P type conductivity modifiers are then introduced into the body 12 through the opening 78 to form the P well region 20 by diffusion in conventional manner.

Figure 1:
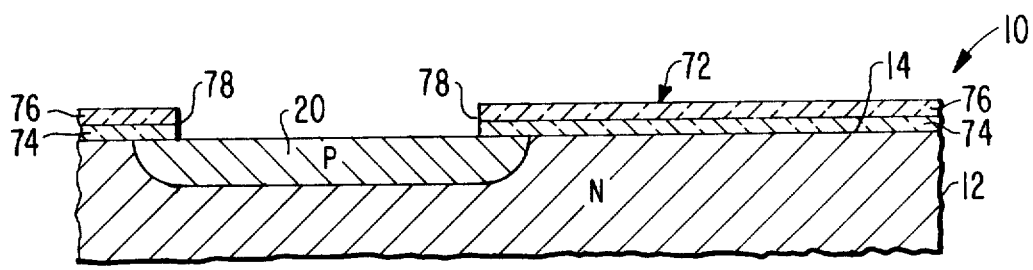
FIGS. 1 to 8 are a series of cross-sectional views of a portion of an integrated circuit device of the complementary MOS type during different stages of the processing thereof in accordance with the novel features of the invention.
Figure 2:
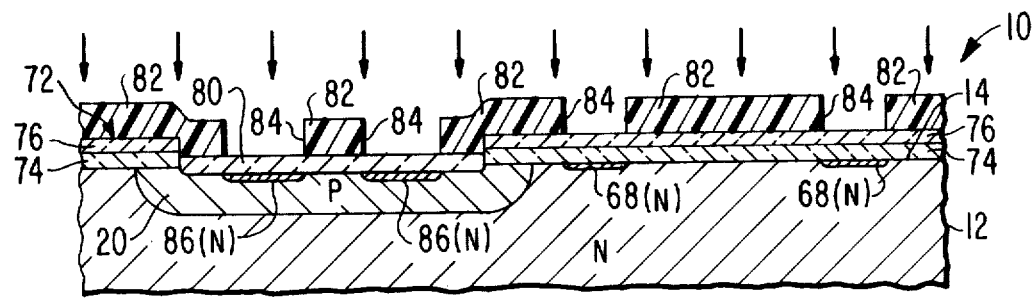

The next steps in the present process are illustrated in FIG. 2. Once the P well region 20 is formed, a second masking coating 80 which is free of any opening, is formed within the opening 78 in the first masking coating 72. The second masking coating 80 is of a material which is soluble in the same solvent as the first layer 74 of the first masking coating 72 and conveniently may be of silicon dioxide formed by thermally oxidizing the surface 14 within aperture 78 of the body 12. Inasmuch as such oxidation consumes a portion of the body 12, the second masking coating 80 is shown as recess somewhat into the surface.

At this stage of the process, a first layer 82 of photoresist is deposited on the first and second masking coatings 72 and 80. Openings 84 are formed in the photoresist layer 82 at predetermined locations adjacent to both the masking coatings at which locations regions of both relatively high and relatively low conductivity of the N type, in this example, are to be introduced. N type conductivity modifiers are then implanted, in a conventional ion implantation apparatus, into the body 12. The parameters of the implantation are adjusted such that the implanted modifiers have sufficient energy to penetrate the first and second layers 74 and 76 of the first masking coating 72 and the second masking coating 80, but insufficient to penetrate the combination of the first and second layers 74 and 76 of the first masking coating 72 and the photoresist 82 or the combination of the second masking coating 80 and the photoresist 82. This step results in the formation of the N type surface channel counteracting regions 68 and in regions 86 within the P well 20 which have enhance concentration of N type modifiers. The regions 86 may or may not, depending upon the fluence of the implanted ions, be converted to N type at this stage in the process.

Figure 3:
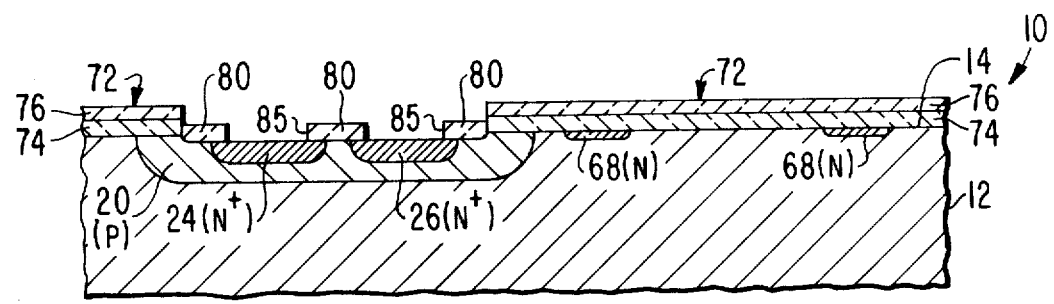

With the photoresist layer 82 in place so as to define exposed areas on the masking coating 80, the device and those exposed areas are contacted with a solvent for the material of the masking coating 80 for a time sufficient to remove those portions thereof which are not protected by either the first layer 82 of photoresist to form openings 85 in the masking coating 80. During this step the first layer 74 is protected from the solvent by the second layer 76 of the masking cating 72. The result of this step after the removal of the photoresist layer 82 is shown in FIG. 3.

N type conductivity modifiers are next diffused, in conventional diffusion apparatus, through the openings 85 thus formed in the second masking coating 80. This diffusion results in the formation of the regions 24 and 26. The diffusion parameters employed to form the regions 24 and 26 should be selected such as to allow for a substantially thick oxidation of the silicon in their vicinity as will be described with reference to FIG. 4.

Figure 4:
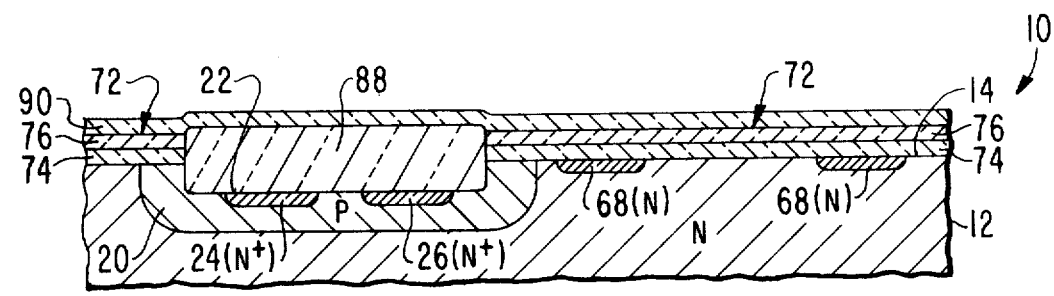

The remaining portions of the second masking coating 80 are next contacted with a suitable solvent to remove them and thereafter the exposed surface of the device is subjected to an oxidizing ambient for a time adequate to grow a relatively thick insulating coating 88 (FIG. 4). This oxidation will consume an additional portion of the body 12 and will result in the establishing of the surface 22. Since such an oxidation step must be carried out at relatively high temperature for a relatively long time, the step will also result in added diffusion of the regions 24 and 26 and enlargement, by diffusion, of the regions 68.

The next step in the present process is to deposit on the entire upper surface of the device 10 a layer 90 of a material which is soluble in the same solvent as is the first layer 74 of the first masking coating 72. Preferably, this layer is silicon dioxide which is deposited in conventional fashion in a silane (SiH4) reactor. This layer 90 is provided as a masking layer to permit photoetching of the layer 76 of the first masking coating 72, as will be described below.

A second layer 92 (FIG. 5) of photoresist is next deposited on the device 10 and openings 94 are formed therein at predetermined locations at which regions of both relatively high and relatively low conductivity of the opposite type, that is P type, are to be introduced. The device 10 is then contacted with a solvent such as buffered hydrofluoric acid for a time adequate to remove the material of the chemically vapored deposited layer 90 wherever it is not protected by the photoresist.

Figure 5:
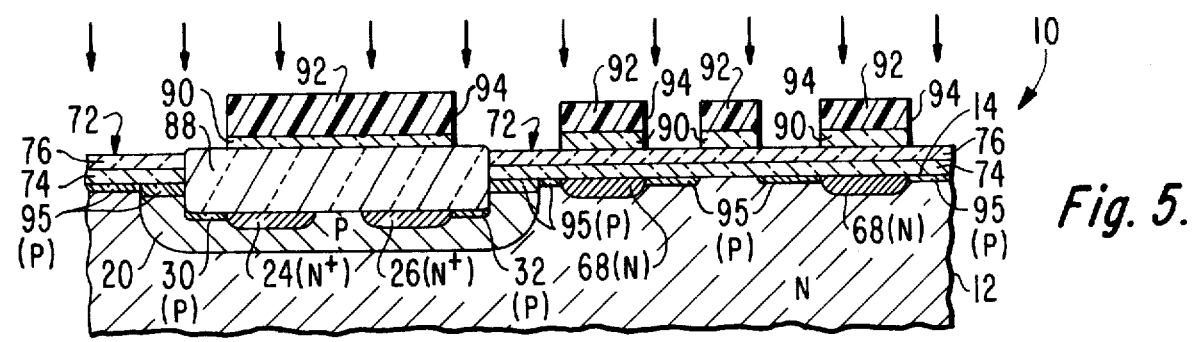

P type conductivity modifiers are then implanted into the body 12 as indicated schematically by the series of arrows in FIG. 5. The energy of this implantation is selected to be sufficient to penetrate the first and second layers 74 and 76 of the first masking coating 72 and the body 88 of insulating material but insufficient to penetrate the combination of either the first and second layers 74 and 76 of the first masking coating 72, the portions of the deposited coating 90 and the photoresist 92 or the combination of the insulating body 88, the remaining portions of the coating 90 and the photoresist 92. The result of this step is to introduce into the body 12 the surface adjacent zones 30 and 32 within the P well 20 as well as other surface adjacent regions 95. The regions 95 will have different characteristics depending upon whether they are implanted into the P type material of the P well 20 or the N type material of the body 12, but these differences are not critical.

With the photoresist in place, the next step in this method is to contact the exposed portions of the silicon nitride second layer 76 of the first masking coating 72 with a slvent for silicon nitride, such as hot phosphoric acid, for a time adequate to remove those portions of the second layer 76 of the first masking coating 72 which are not protected by the coating 90 and the photoresist 92. Then, an etching step is performed in buffered hydrofluoric acid, for example, in order to remove those portons of the first layer 74 of the masking coating 72 to expose bare silicon at the surface 14. Owing to the thickness of the insulating body 88, it will not be removed during this step, the etching being terminated when the thinner areas of the first layer 74 are removed.

Figure 6:
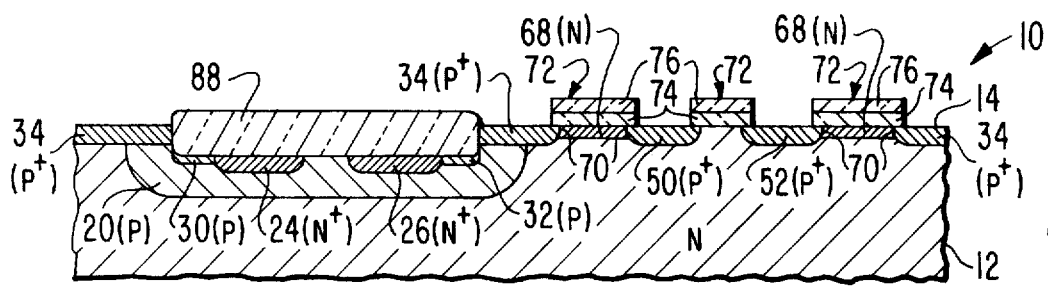

A diffusion of acceptor impurities is now performed in conventional fashion. The acceptors will enter the body 12 at all locations where it is not masked by either the insulating body 88 or the remaining portions of the first masking coating 72. The result of this step, illustrated in FIG. 6, is to create the regions 34 and the regions 50 and 52 of the P type transistor 18. This step also results in the formation of the PN junctions 70.

Figure 7:
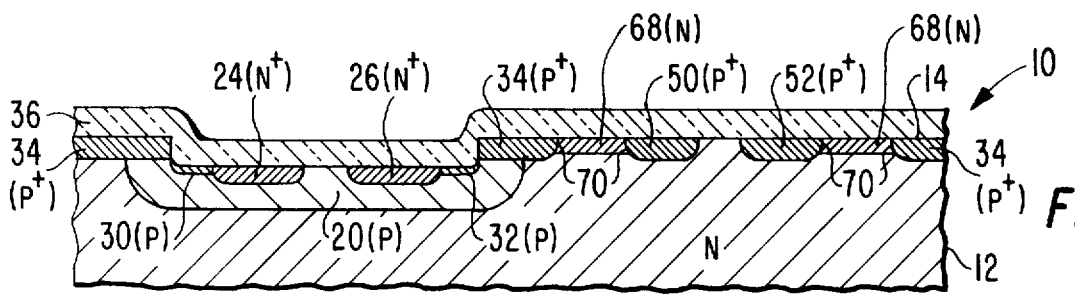
Figure 8:
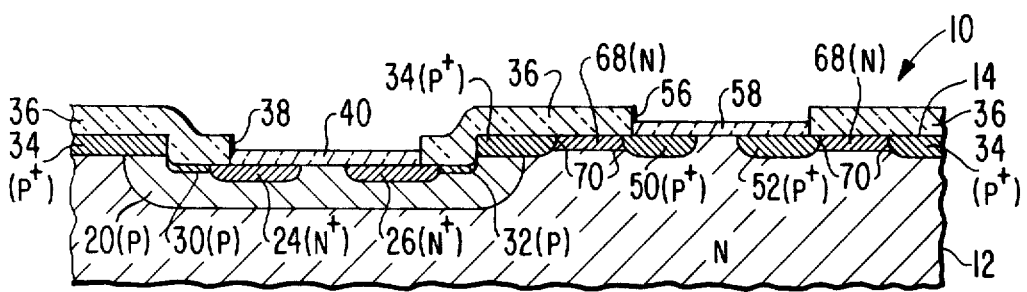

The processing at this point is substantially complete as far as the novelty of the present method is concerned. The balance of the processing is generally conventionally performed. The next step is to remove, with suitable etchants, any of the remaining masking layers and the insulating body 88 to expose bare silicon on the upper surface of the body 12. Then, an oxidation step is performed to grow on the entire surface of the body 12 the relatively thick, passivating, insulating layer 36, and the result of this step is shown in FIG. 7.

The passivating insulating layer 36 is next coated with a photoresist (not shown) which is employed to mask the layer for the formation of the openings 38 and 56 adjacent to the active areas which will become the transistors 16 and 18, respectively. The apertures 38 and 56 are then formed by etching the material of the passivating, insulating layer 36 and thereafter the gate insulating layers 49 and 58 are formed, again in conventional manner.

A new photoresist coating is then applied to the device 10 and defined to expose the material of the gate insulating layer 40 and 58 after which the contact openings 42 and 60 for the transistors 16 and 18, respectively, are formed. A continuous coating of a conductor material such as aluminum is then deposited on the upper surface of the device 10 and defined into the conductors 44, 46, 48, 62, 64 and 66, respectively, at which time the device is essentially complete.

By carrying out the above process, four different conductivity types and/or degrees of resistivity may be obtained by means of only two photoresist steps, i.e. the steps illustrated in FIGS. 2 and 5. The result is a device which has compact channel counteracting zones with no spacing between them. This leads to increased circuit component density and better yields.

The use of a two layer masking coating such as the first masking coating 72 and the use of the thick insulating body 88 permits multiple doping levels to be achieved with one photomasking operation. Thus, even if it is not desired to make complementary MOS devices with surface channel counteracting means of opposite type conductivity, the present method has value in the formation of regions having different doping levels with only a single photomasking step.

What is claimed is:

1. A method of making a semiconductor device comprising a body of semiconductor material having a surface and which has regions of relatively high and relatively low conductivity comprising:
    forming on a surface of said body a masking coating having relatively thick portions and relatively thin portions,
    depositing on said masking coating a layer of photoresist and forming openings therein at predetermined locations adjacent to both relatively thick portions and relatively thin portions on said masking coating at which regions of both relatively high and relatively low conductivity are to be introduced,
    implanting conductivity modifiers into said body with sufficient energy to penetrate said masking coating but with insufficient energy to penetrate the combination of the masking coating and said photoresist,
    without removing said photoresist, contacting the exposed areas of said masking coating with a solvent therefore for a time adequate to remove only the relatively thin portions thereof, and
    diffusing conductivity modifiers into the semiconductor body through the areas so removed.

2. A method as defined in claim 1 wherein said body is silicon and said masking coating comprises thermally grown silicon dioxide,
    said thick and thin portions of said masking coating being formed by
    growing on said surface of said body a continuous, relatively thin layer of silicon dioxide,
    coating said thin layer of silicon dioxide with a layer of silicon nitride,
    photolithographically removing a portion of said silicon nitride layer and said thin silicon dioxide layer in the pattern of said thick portion of said masking coating, and thereafter
    growing said thick portion of said masking coating.

3. A method as defined in claim 2 wherein the energy of said implanting step is sufficient to cause said conductivity modifiers to penetrate both said silicon nitride and silicon dioxide layers.

4. A method of making a complementary MOS integrated circuit device having non-spaced surface channel counteracting zones of mutually opposite type conductivity, from a body of semiconductive material initially of one type conductivity having a surface, comprising the steps of:
    forming on said surface of said body a multi-layer first masking coating, said first masking coating including a first layer, on said surface, of a material which is soluble in a given solvent, and a second layer above said first layer which is of a material which is insoluble in said given solvent, said masking coating having an opening patterned to define the surface shape of a well region of conductivity type opposite to that of said body, forming a second masking coating, free of any opening, within said opening in said first masking coating, said second masking coating being of a material which is soluble in said given solvent, depositing a layer of photoresist on said first and second masking coatings and forming openings therein at predetermined locations adjacent to both said masking coatings at which regions of both relatively high and relatively low conductivity of said one type are to be introduced, implanting conductivity modifiers of said one type into said body with sufficient energy to penetrate said first and second layers of said first masking coating, or said second masking coating, but insufficient to penetrate the combination of said first and second layers of said first masking coating and said photoresist, or the combination of said second masking coating and said photoresist, contacting the exposed areas of said second masking coating with said given solvent for a time sufficient to remove those portions of said second masking coating which are not protected by said first layer of photoresist, diffusing conductivity modifiers of said one type through the openings so formed, removing the remainder of said second masking coating and thereafter subjecting the exposed surfaces of said device to an oxidizing ambient for a time adequate to grow a relatively thick insulating coating within the opening in said first masking coating.

depositing by a chemical vapor deposition process a layer of a material which is soluble in said given solvent over the entire surface of said devices.

depositing a second layer of photoresist on said device and forming openings therein at predetermined locations at which regions of both relatively high and relatively low opposite type conductivity are to be introduced, contacting said devices with said given solvent for a time adequate to remove the material of said chemically vapor deposited layer which is not protected by said photoresist, implanting conductivity modifiers of said opposite type into said body with sufficient energy to penetrate said first and second layers of said first masking coating and said body of insulting material but insufficient to penetrate the combination of either the first and second layers of said first masking coating and the photoresist or the combination of the insulating body and the photoresist, contacting said device with a solvent for said second layer of said first masking coating and thereafter contacting said device with said given solvent for a time sufficient to remove the exposed portions of said first layer of said first masking coating to expose said surface of said body, and diffusing conductivity modifiers of said opposite type into the areas so exposed.

5. A method as defined in claim 4 comprising the further steps of contacting said device with said given solvent to remove the remaining portions of said first layer of said first masking coating and said insulating body, heating said device in an oxidizing atmosphere for a time adequate to grow a relatively thick insulating coating thereon, removing portions of said thick insulating coating in the areas thereof adjacent to the regions formed by diffusion as defined in claim 4, reheating said device in an oxidizing ambient for a time adequate to grow a relatively thin insulating coating in the areas exposed in the previous step, forming openings in said thin insulating coating adjacent to said regions formed by diffusion, and depositing metal contacts having portions extending through openings last formed into contact with said regions formed by diffusion.

6. A method as defined in claim 4 wherein a well region of conductivity type opposite to that of said body is formed in said body subsequent to the step of forming said first masking coating.

* * * * *